(12) United States Patent
Applebaum

(10) Patent No.: US 7,115,812 B2
(45) Date of Patent: Oct. 3, 2006

(54) RADIATION SHIELDED SEMICONDUCTOR PACKAGE

(75) Inventor: Edward Applebaum, La Mirada, CA (US)

(73) Assignee: Solid State Devices, Inc., La Mirada, CA (US)

( * ) Notice: Subject to any disclaimer, the term of this patent is extended or adjusted under 35 U.S.C. 154(b) by 249 days.

(21) Appl. No.: 10/931,767

(22) Filed: Aug. 31, 2004

(65) Prior Publication Data

US 2005/0051349 A1 Mar. 10, 2005

Related U.S. Application Data

(60) Provisional application No. 60/500,544, filed on Sep. 5, 2003.

(51) Int. Cl.
*H05K 9/00* (2006.01)

(52) U.S. Cl. ............... 174/35 R; 174/52.4; 257/659

(58) Field of Classification Search .............. 174/35 R, 174/35 GC, 35 MS, 52.1, 52.3, 52.4; 264/272.11; 361/816, 818; 257/659, 660
See application file for complete search history.

(56) References Cited

U.S. PATENT DOCUMENTS

| | | | | | |
|---|---|---|---|---|---|
| 4,888,449 | A | * | 12/1989 | Crane et al. | ............... 174/52.4 |
| 5,317,107 | A | * | 5/1994 | Osorio | ...................... 174/52.4 |
| 5,825,042 | A | * | 10/1998 | Strobel et al. | ........... 250/515.1 |
| 6,262,362 | B1 | * | 7/2001 | Czjakowski et al. | ...... 174/35 R |
| 6,452,263 | B1 | * | 9/2002 | Benedetto | .................... 257/703 |

\* cited by examiner

*Primary Examiner*—Dean A. Reichard
*Assistant Examiner*—Carmelo Oliva
(74) *Attorney, Agent, or Firm*—Brown Raysman Millstein Felder & Steiner LLP

(57) ABSTRACT

A radiation shielded semiconductor package for use in any variety of industries and applications is disclosed. In one embodiment, a radiation shielded semiconductor package comprises a radiation shielding base, one or more non-shielding sidewalls coupled to the shielding base, one or more radiation shielding flanges coupled to the sidewall, and one or more non-shielding coupling flanges coupled to the shielding flange. The base, the non-shielding sidewall, the shielding flange, and the non-shielding coupling flange define a device cavity, and at least one semiconductor device is positioned within the device cavity. A radiation shielding lid is coupled to the coupling flange and hermetically seals the semiconductor device within the device cavity. The shielding lid comprises shielding lid body and a non-shielding lid flange coupled to the lid body and is configured to couple to the coupling flange.

20 Claims, 4 Drawing Sheets

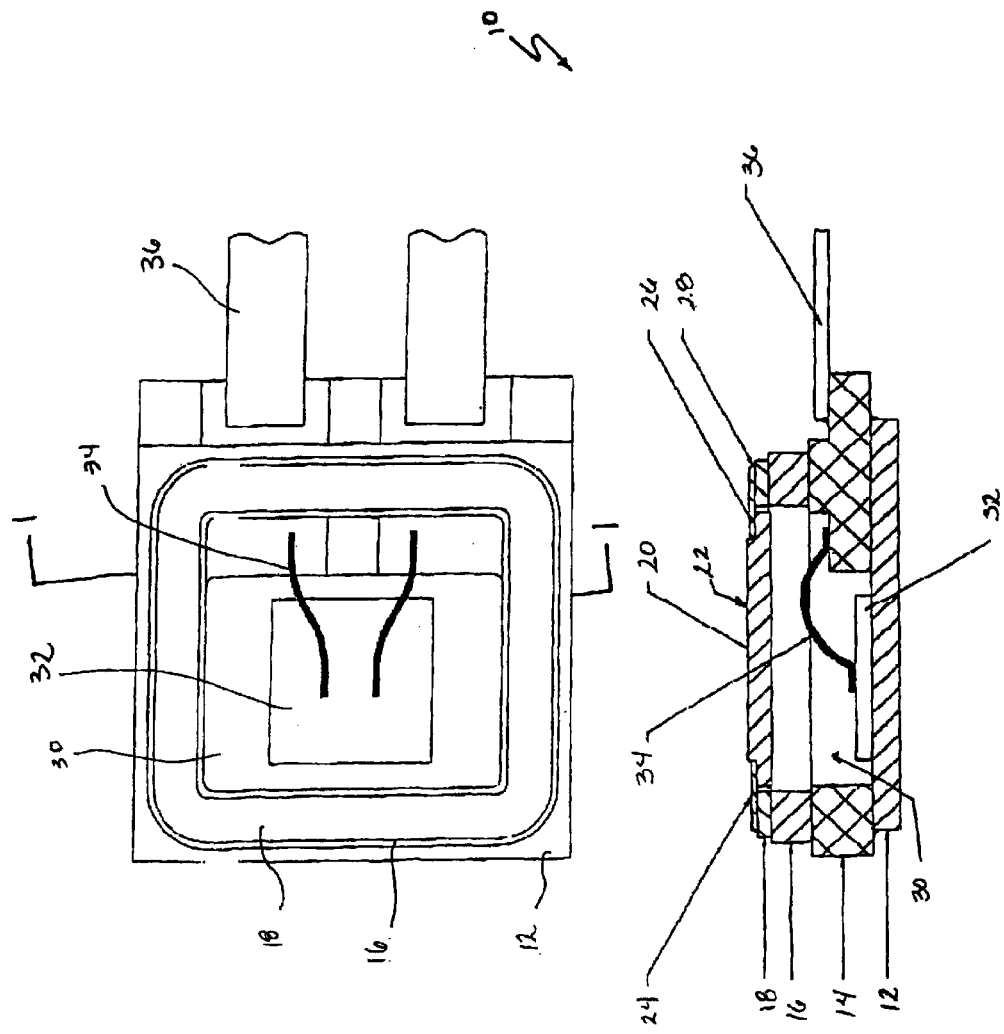

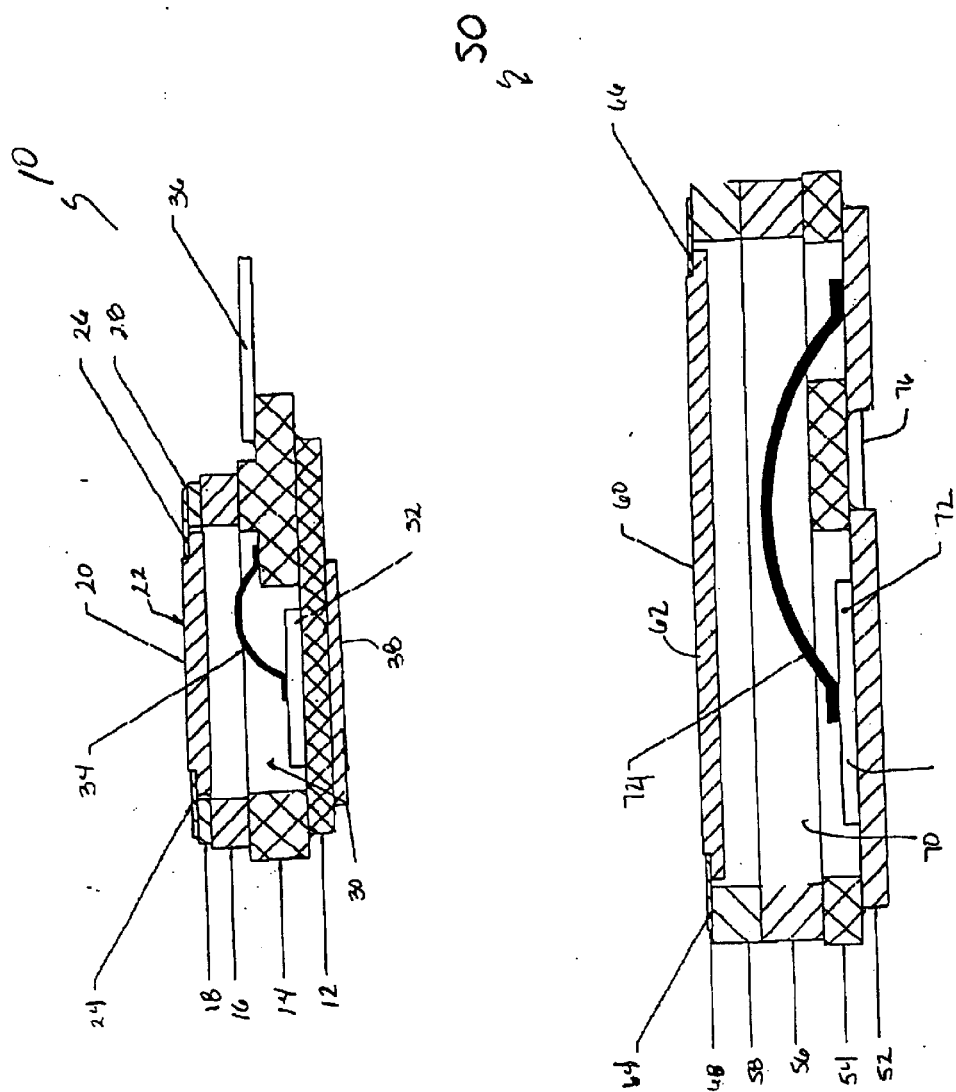

RADIATION SHIELDED SEMICONDUCTOR PACKAGE

CROSS-REFERENCE TO RELATED APPLICATIONS

This application claims priority to and incorporates by reference in its entirety the contents of U.S. Provisional Pat. Appl. Ser. No. 60/500,544, filed Sep. 5, 2003, naming Edward Applebaum as inventor.

BACKGROUND

Semiconductor devices have gained widespread acceptance in a vast array of fields. Indeed, these devices have changed the way we live. Exceedingly, these devices are being utilized more and more in challenging environments, such as high radiation environments. The negative effects of radiation on integrated circuits and semiconductors have been long known. As a result, a number of techniques have been developed to protect integrated circuits and semiconductor packages from radiation. For example, in space applications, a number of methodologies have been employed with varying degrees of success.

One technique presently used requires the manufacture of specially designed radiation hardened or radiation tolerant semiconductor devices configured to operate within a radiation environment. While these specially designed devices have proven successful in some applications, a number of shortcomings have been identified. For example, the performance characteristics of these specially designed devices are less than optimal. Further, the cost of the devices is much higher than commercially available semiconductor devices.

In response to the shortcoming associated with specially designed devices, a number of alternate methodologies have been developed. One technique utilizes one or more layers of material to house and protect integrated circuits from the bombardment of natural radiation. External component shielding consists of satellite body panels, printed circuit boards, and any other materials that form the body of a satellite or a device carried by the satellite. Optionally, specially designed boxes constructed of selected shielding materials may be used to house and protect the integrated circuits and semiconductors from radiation. While these external-shielding techniques have proved successful in some applications, a number of shortcomings have been identified. For example, the addition of external shields to a satellite increases satellite weight, thereby requiring more fuel to deliver and maintain a satellite within a desired orbit. In addition, external shields occupy additional space on the satellite, thereby limiting payload capacity.

Recently, a number of radiation shielded integrated circuit packages have been developed. Generally, these devices utilize a radiation shielding material integrated into the integrated circuit or semiconductor device package. Typically, a radiation shield is bonded to a surface of the device package. While these devices addressed some shortcomings of external shield architectures, a number of shortcomings of these systems have been identified. For example, specialized manufacturing techniques are commonly required to incorporate the radiation shielding materials into the integrated circuit or semiconductor package manufacturing process. As such, the time and cost of manufacturing these devices is considerably higher than conventional semiconductor manufacturing costs.

In light of the foregoing, there is an ongoing need for a radiation shielded integrated circuit or semiconductor package which may permit the use of commercially available semiconductors in a radiation environment.

SUMMARY

The present application discloses radiation shielded devices for use in any variety of industries and applications. In one embodiment, a radiation shielded device is disclosed and includes a radiation shielding base, one or more non-shielding sidewalls coupled to the shielding base, one or more radiation shielding flanges coupled to the sidewall, one or more non-shielding coupling flanges coupled to the shielding flange, wherein the base, the non-shielding sidewall, the shielding flange, and the non-shielding coupling flange define a device cavity, at least one integrated circuit or semiconductor device positioned within the device cavity, and a radiation shielding lid coupled to the coupling flange and sealing the integrated circuit or semiconductor device within the device cavity, the shielding lid having a shielding lid body and a non-shielding lid flange coupled to the lid body and configured to couple to the coupling flange.

In an alternate embodiment, the present application discloses a radiation shielded device and includes a shielding base manufactured from a high Z material, a non-shielding sidewall coupled to the shielding base, a radiation shielding flange manufactured from a high Z material coupled to the sidewall, a non-shielding coupling flange coupled to the shielding flange, wherein the base, the non-shielding sidewall, the shielding flange, and the non-shielding coupling flange define a device cavity, at least one integrated circuit or semiconductor device positioned within the device cavity, and a radiation shielding lid manufactured from a high Z material coupled to the coupling flange and sealing the integrated circuit or semiconductor device within the device cavity, the shielding lid having a shielding lid body and a non-shielding lid flange coupled to the lid body and configured to couple to the coupling flange.

In addition, the present application discloses various methods of manufacturing a radiation shielded device. In one embodiment, a method of manufacturing a radiation shielded device is disclosed and includes coupling one or more non-shielding sidewalls to a shielding base, coupling one or more shielding flanges coupled to the sidewall, coupling one or more non-shielding coupling flanges coupled to the shielding flange, wherein the base, the non-shielding sidewall, the shielding flange, and the non-shielding coupling flange define a device cavity, positioning at least one integrated circuit or semiconductor device positioned within the device cavity, and coupling a radiation shielding lid to the coupling flange thereby sealing the integrated circuit or semiconductor device within the device cavity, the shielding lid having a shielding lid body and a non-shielding lid flange coupled to the lid body and configured to couple to the coupling flange.

In an alternate embodiment, a method of making a radiation shielded device is disclosed and includes coupling one or more non-shielding sidewalls to a shielding base, coupling one or more shielding flanges coupled to the sidewall, coupling one or more non-shielding coupling flanges coupled to the shielding flange, wherein the base, the non-shielding sidewall, the shielding flange, and the non-shielding coupling flange define a device cavity, de-rating a voltage rating of at least one commercial integrated circuit or semiconductor device by about 50%, positioning the integrated circuit or semiconductor device positioned within the device cavity, and coupling a radiation shielding lid to the coupling flange thereby sealing the integrated circuit or semiconductor device within the device cavity, the shielding lid having a shielding lid body and a non-shielding lid flange coupled to the lid body and configured to couple to the coupling flange.

Other features and advantages of the embodiments of the various radiation shielded devices disclosed herein will become apparent from a consideration of the following detailed description.

BRIEF DESCRIPTION OF THE DRAWINGS

Various radiation shielded devices will be explained in more detail by way of the accompanying drawings, wherein:

FIG. 1 shows cross-sectional view of an embodiment of a radiation shielded integrated circuit or semiconductor package as viewed along the lines 1—1 of FIG. 2;

FIG. 2 shows a top view of the embodiment of the radiation shielded integrated circuit or semiconductor package shown in FIG. 1;

FIG. 4 shows a cross-sectional view of an embodiment of a radiation shielded integrated circuit or semiconductor package as viewed along the lines 1—1 of FIG. 2;

FIG. 5 shows a cross-sectional view of an embodiment of a radiation shielded integrated circuit or semiconductor package as viewed along the lines 1—1 of FIG. 2;

DETAILED DESCRIPTION

FIGS. 1–3C show an embodiment of a radiation shielded integrated circuit or semiconductor package. As shown, the shielded package 10 includes a shielding base 12 having a sidewall 14 extending therefrom. In one embodiment, the shielding base 12 is manufactured from one or more radiation shielding materials or high Z materials, including, without limitation, tungsten, copper-tungsten alloys, tantalum, molybdenum, or other materials capable of limiting the amount of radiation passing therethrough. Optionally, the shielding base 12 may be manufactured from one or more non-shielding materials having one or more high Z materials included therein, thereby providing a doped shielding base. The non-shielding sidewall 14 may be manufactured from a variety of materials commonly used in the integrated circuit or semiconductor manufacturing process, including, without limitation, ceramic materials and metallic materials. For example, in one embodiment the sidewall 14 is manufactured from an Alumina ceramic material. The shielding base 12 and the sidewall 14 may be coupled using any number of techniques, including, without limitation, brazing, welding, soldering, and adhesively bonding.

Figure 3A:
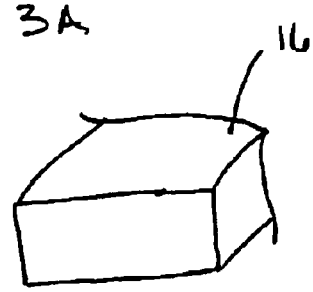
FIG. 3A shows a side view of an embodiment of a shielding flange for use with a radiation shielded integrated circuit or semiconductor package wherein the shielding flange forms a planar surface.
Figure 3B:
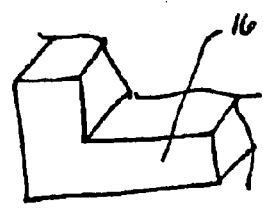
FIG. 3B shows a side view of an alternate embodiment of a shielding flange for use with a radiation shielded integrated circuit or semiconductor package wherein the shielding flange includes a surface irregularity.
Figure 3C:
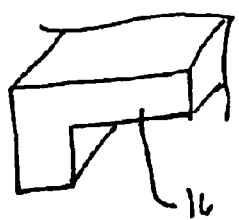
FIG. 3C shows a side view of an alternate embodiment of a shielding flange for use with a radiation shielded integrated circuit or semiconductor package wherein the shielding flange includes a surface irregularity.

A shielding flange 16 may be coupled to the sidewall 14 using any number of techniques, including, without limitation, brazing, welding, soldering, and adhesive bonding. Like the shielding base 12, the shielding flange 16 may be manufactured from one or more radiation shielding materials or high Z materials and may be configured to reduce or prevent a quantity of radiation passing therethrough. For example, in one embodiment, the shielding flange may be configured to reduce the quantity of radiation passing therethrough from about 5 Mrad(si) to about 10 Krad (si) from passing therethrough, thereby shielding the internal components of an integrated circuit from incident external radiation. In an alternate embodiment, the sidewall 14 may be constructed of a high Z radiation shielding material and having a shielding flange 16 integrally formed therewith. In one embodiment, the sidewall 14 and the shielding flange 16 are integral thereby forming a shielding sidewall. A coupling flange 18 may be coupled to the sidewall 14 using techniques known in the art including brazing, soldering, welding, and adhesively bonding. As shown in FIGS. 1 and 3A, the shielding flange 16 forms a substantially planar surface. In an alternate embodiment, shielding flange 16 may include one or more surface irregularities formed thereon. As shown in FIG. 3B-3C, exemplary surface irregularities include, without limitation, lips, and channels formed on the shielding flange 16.

Referring again to FIGS. 1 and 2, the radiation shielded package 10 includes a coupling flange 18 coupled to the shielding flange 16. In one embodiment, the coupling flange 18 is manufactured from a variety of non-radiation shielding materials commonly used in the integrated circuit or semiconductor manufacturing process, including, without limitation, ceramic materials and metallic materials. In an alternate embodiment, the coupling flange 18 may be manufactured from a shielding material such as a high Z material configured to reduce or prevent the quantity of radiation passing therethrough. The coupling flange 18 may be coupled to the shielding flange 16 using any number of techniques, including, without limitation, brazing, welding, soldering, and adhesively bonding. FIG. 2 shows a view of the internal components of a radiation shielded package 10 having a lid removed therefrom.

As shown in FIG. 1, a shielding lid 20 is coupled to or otherwise secured to the coupling flange 18 of the shielded package 10. The shielding lid 20 includes a shielding lid body 22 and lid flange 24. The shielding lid body 22 may be manufactured from a variety of high Z materials, including, without limitation, tungsten, copper-tungsten alloys, tantalum, molybdenum, or other materials capable of limiting the amount of radiation passing therethrough. The lid body 22 may be coupled together using any number of techniques, including, without limitation, brazing, welding, soldering, and adhesively bonding. For example, the lid flange 24 may be brazed or soldered to the lid body 22, thereby forming a lid-bonding region 26 on the lid 20. As shown in FIG. 1, in one embodiment the lid body 22 is configured to be positioned within the device cavity 30 formed by the shielding base 12, the sidewall 14, the shielding flange 16, and the coupling flange 18. Optionally, the lid body 22 may be located outside the device cavity 30. The lid flange 24 is configured to engage and couple to the coupling flange 18 thereby forming a coupling region 28. The lid flange 24 may be coupled to the coupling flange 18 using any number of techniques, including, without limitation, brazing, welding, soldering, and adhesively bonding. In the illustrated embodiment, the lid flange 24 is resistance welded to coupling flange 18, thereby forming a coupling region on the shielded package 10. As such, the lid flange 24 and the coupling flange 18 may be manufactured from a weldable material. For example, the lid flange 24, the coupling flange 18, and/or both may be manufactured from Kovar. In one embodiment, the lid flange 24 is manufactured from non-radiation shielding materials commonly used in the integrated circuit or semiconductor manufacturing process, including, without limitation, ceramic materials and metallic materials.

Referring again to FIG. 1, at least one integrated circuit or semiconductor device or die 32 may be positioned within the device cavity 30 formed by the shielding base 12, the sidewall 14, the shielding flange 16, and the coupling flange 18. For example, in one embodiment, a single integrated circuit or semiconductor device 32 is positioned within the device cavity 30 thereby providing a discreet radiation shielded device. In an alternate embodiment, a plurality of integrated circuits or semiconductor devices 32 are positioned within the device cavity 30 thereby providing a hybrid radiation shielded device. As such, the device cavity 30 may house multiple integrated circuits or semiconductor devices 32. Further, the multiple integrated circuits or semiconductor devices 32 positioned within the device cavity 30 may be the same or may be any variety of devices. In an alternate embodiment, the one or more integrated circuits or semiconductor devices 32 positioned within the device cavity 30 may comprise radiation hardened devices, non-radiation hardened devices, or both. At least one device interconnect 34 may be positioned within the device cavity 30 and may couple the integrated circuit or semiconductor device 32 to an external lead 36 located outside the device cavity 30.

FIG. 4 shows an alternate embodiment of a radiation shielded integrated circuit or semiconductor package. In the illustrated embodiment the reference numerals 10, 12, 14, 16, 18, 20, 22, 24, 26, 28, 30, 32, 34, and 36 have analogous meanings to the reference numerals identifying the features of the embodiment shown in FIG. 1. As shown in FIG. 4, the base 12 may be manufactured from a non-shielding material commonly used in the integrated circuit or semiconductor manufacturing process, including, without limitation, ceramic materials and metallic materials. Optionally, the base 12 may be manufactured from a radiation shielding material. At least one radiation shield plate 38 manufactured from one or more high Z materials, including, without limitation, tungsten, copper-tungsten alloys, tantalum, molybdenum, or other materials capable of limiting the amount of radiation passing therethrough may be attached to the base 12. In one embodiment, the shielding plate 38 is brazed or soldered to the base 12. In the alternative, the shield plate 38 may be coupled to the base 12 using any number of techniques, including, without limitation, welding, soldering, and adhesively bonding. In the illustrated embodiment, the shield plate 38 is coupled to an exterior surface of the base 12. In an alternate embodiment, the shield plate 38 may be coupled to an interior surface of the base 12, thereby positioning the shield plate 38 within the device cavity 30. When positioned within the device cavity 30, the shield plate may be configured to receive the integrated circuit or semiconductor device 32 thereon. In the alternative, at least one substrate (not shown) maybe positioned on the shield plate 38 thereby isolating the integrated circuit or semiconductor device 32 from the shield plate 38. For example, the substrate (not shown) may be configured to thermally and/or electrically isolate the integrated circuit or semiconductor device 32 from the shield plate 38.

FIG. 5 shows another embodiment of a radiation shielded integrated circuit or semiconductor package. As shown, the shielded package 50 includes a shielding base 52 manufactured from a high Z material coupled to a sidewall 54. Exemplary high z materials, without limitation, tungsten, copper-tungsten alloys, tantalum, molybdenum, or other materials capable of limiting the amount of radiation passing therethrough. In one embodiment the sidewall 54 is constructed from a non-shielding material commonly used in the integrated circuit or semiconductor manufacturing process, including, without limitation, ceramic materials and metallic materials. In an alternate embodiment, the sidewall 54 may be constructed from a radiation shielding material.

A shielding flange 56 may be coupled to the sidewall 54. Like the base, the shielding flange 56 may be manufactured from a variety of high Z materials include, without limitation, tungsten, copper-tungsten alloys, tantalum, molybdenum, or other materials capable of limiting the amount of radiation passing therethrough. A coupling flange 58 may be coupled to the shielding flange 56. The coupling flange 58 may be constructed from a radiation shielding or non-radiation shielding material.

As shown in FIG. 5, the base 52, sidewall 54, shielding flange 56, and coupling flange 58 form a device cavity 70. A lid 60 may be coupled to the coupling flange 58 thereby enclosing the device cavity 70. The lid 60 includes a radiation shielding lid body 62 and a lid flange 64. The shielding lid body 62 may be manufactured from a variety of high Z materials include, without limitation, tungsten, copper-tungsten alloys, tantalum, molybdenum, or other materials capable of limiting the amount of radiation passing therethrough. The lid flange 64 may be coupled to the lid body 62 using several methods known in the art. For example, the lid flange 64 and lid body 62 may be brazed, soldered, welded, or adhesively bonded together thereby forming a bond area 66. In one embodiment, the lid flange 64 may be manufactured from a non-radiation shielding material such as ceramic materials and metallic materials. In an alternate embodiment, the lid flange may be manufactured from a high Z material, including, for example, tungsten, copper-tungsten alloys, tantalum, molybdenum, or other materials capable of limiting the amount of radiation passing therethrough. The lid 60 may be coupled to the coupling flange 58 using several methods known in the art, including brazing, welding, or adhesively bonding, thereby forming a coupling region 68.

Referring again to FIG. 5, an integrated circuit or semiconductor device 72 may be positioned within the device cavity 70 of the shielded package 50. Similarly, at least one device interconnect 74 may be positioned within the device cavity 70 and in communication with the integrated circuit or semiconductor device 72. At least one contact pad 76 is located on the radiation shielded package 60 thereby permitting the shielded package 60 to be electrically connected to a circuit board or other device. In the illustrated embodiment, the contact pad 76 is located on the base 12 and is in communication with the integrated circuit or semiconductor device 72 through the device interconnect 74. As such, the radiation-shielded package 60 may be mounted to a circuit board or other device using surface mounting techniques known in the art.

Figure 6:
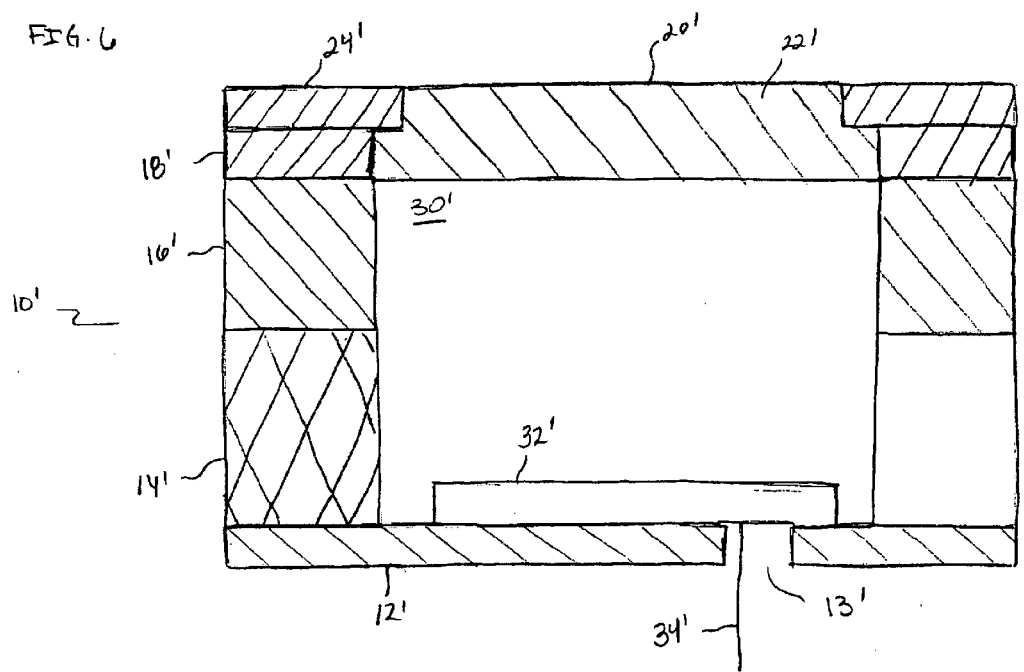
FIG. 6 shows a cross-sectional view of an embodiment of a radiation shielded integrated circuit or semiconductor package as viewed along the lines 1—1 of FIG. 2.

FIGS. 1–5 illustrate one embodiment of a radiation shielded integrated circuit or semiconductor package 10 configured to protective house one or more integrated circuits or semiconductor devices 32. As shown, the radiation shielded package 10 may be configured to couple to a substrate, such as circuit board, using surface mount technology. Those skilled in the art will appreciate that the radiation shielded package disclosed herein may be configured the radiation shielded package 10 may be configured to couple to a substrate, such as circuit board, using non-surface mount technology. FIG. 6 shows one embodiment of a non-surface mount radiation shielded package. As shown, the shielded package 10' includes a shielding base 12' having a sidewall 14' extending therefrom. In one embodiment, the shielding base 12' is manufactured from one or more radiation shielding materials or high Z materials, including, without limitation, tungsten, copper-tungsten alloys, tantalum, molybdenum, or other materials capable of limiting the amount of radiation passing therethrough. Optionally, the shielding base 12' may be manufactured from one or more non-shielding materials having one or more high Z materials included therein, thereby providing a doped shielding base. The non-shielding sidewall 14' may be manufactured from a variety of materials commonly used in the integrated circuit or semiconductor manufacturing process, including, without limitation, ceramic materials and metallic materials. For example, in one embodiment the sidewall 14' is manufactured from an Alumina ceramic material. The shielding base 12' and the sidewall 14' may be coupled using any number of techniques, including, without limitation, brazing, welding, soldering, and adhesively bonding.

A shielding flange 16' may be coupled to the sidewall 14' using any number of techniques, including, without limitation, brazing, welding, soldering, and adhesive bonding. Like the shielding base 12', the shielding flange 16' may be manufactured from one or more radiation shielding materials or high Z materials and may be configured to reduce or prevent a quantity of radiation passing therethrough. For example, in one embodiment, the shielding flange may be configured to reduce the quantity of radiation passing therethrough from about 5 Mrad(si) to about 10 Krad (si) from passing therethrough, thereby shielding the internal components of an integrated circuit from incident external radiation. In an alternate embodiment, the sidewall 14' may be constructed of a high Z radiation shielding material and having a shielding flange 16' integrally formed therewith. In one embodiment, the sidewall 14' and the shielding flange 16' are integral thereby forming a shielding sidewall. A coupling flange 18' may be coupled to the sidewall 14' using techniques known in the art including brazing, welding, and adhesively bonding. As shown in FIG. 6, the shielding flange 16' forms a substantially planar surface. In an alternate embodiment, shielding flange 16' may include one or more surface irregularities formed thereon. Exemplary surface irregularities include, without limitation, lips, and channels formed on the shielding flange 16'.

The radiation shielded package 10' includes a coupling flange 18' coupled to the shielding flange 16'. In one embodiment, the coupling flange 18' is manufactured from a variety of non-radiation shielding materials commonly used in the integrated circuit or semiconductor manufacturing process, including, without limitation, ceramic materials and metallic materials. In an alternate embodiment, the coupling flange may be manufactured from a shielding material such as a high Z material configured to reduce or prevent the quantity of radiation passing therethrough. The coupling flange 18' may be coupled to the shielding flange 16 using any number of techniques, including, without limitation, brazing, welding, soldering, and adhesively bonding.

As shown in FIG. 6, a shielding lid 20' is coupled to or otherwise secured to the coupling flange 18' of the shielded package 10'. The shielding lid 20' includes a shielding lid body 22' and lid flange 24'. The shielding lid body 22' may be manufactured from a variety of high Z materials, including, without limitation, tungsten, copper-tungsten alloys, tantalum, molybdenum, or other materials capable of limiting the amount of radiation passing therethrough. The lid body 22' may be coupled together using any number of techniques, including, without limitation, brazing, welding, soldering, and adhesively bonding. For example, the lid flange 24' may be brazed or soldered to the lid body 22', thereby forming a lid-bonding region 26' on the lid 20'. As shown in FIG. 6, in one embodiment the lid body 22' is configured to be positioned within the device cavity 30' formed by the shielding base 12', the sidewall 14', the shielding flange 16', and the coupling flange 18'. Optionally, the lid body 22' may be located outside the device cavity 30'. The lid flange 24' is configured to engage and couple to the coupling flange 18' using any number of techniques, including, without limitation, brazing, welding, soldering, and adhesively bonding. In the illustrated embodiment, the lid flange 24' is resistance welded to coupling flange 18', thereby forming a coupling region on the shielded package 10'. In one embodiment, the lid flange 24' is manufactured from non-radiation shielding materials commonly used in the integrated circuit or semiconductor manufacturing process, including, without limitation, ceramic materials and metallic materials.

At least one integrated circuit or semiconductor device or die 32' may be positioned within the device cavity 30' formed by the shielding base 12', the sidewall 14', the shielding flange 16', and the coupling flange 18'. For example, in one embodiment, a single integrated circuit or semiconductor device 32' is positioned within the device cavity 30' thereby providing a discreet radiation shielded device. Further, the shielding base 12' may include one or more passthroughs 13' configured to permit one or more leads 34' or other conduits to traverse therethorugh. In the illustrated embodiment, a single lead 34' is coupled to an integrated circuit or semiconductor device 32' positioned within the device cavity 30'. Optionally, the passthroughs may be formed anywhere on the body of the radiation shielded package 10'.

Figure 7:
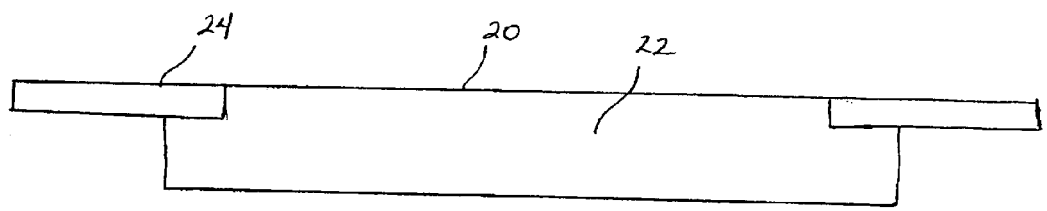
FIG. 7 shows an embodiment of a lid of use with a radiation shielded integrated circuit or semiconductor package.
Figure 8:
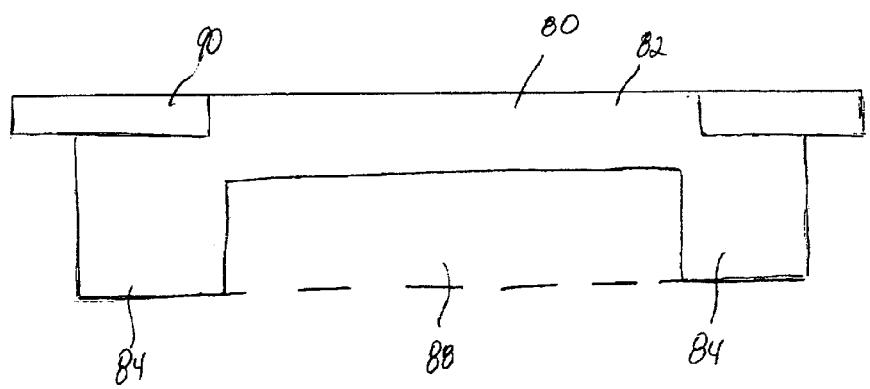
FIG. 8 shows an alternate embodiment of a lid of use with a radiation shielded integrated circuit or semiconductor package.

FIG. 7 shows an embodiment of shielding lid. In the illustrated embodiment, the shielding lid 20 includes a lid body having a lid flange 24 coupled thereto. FIG. 8 shows an alternate embodiment of a shielding lid. As shown, the shielding lid 80 includes a shielding lid body 82 one or more shielding extensions 84 positioned thereon. In the illustrated embodiment, two shielding extensions 84 and 86 are positioned on the lid body 82. Optionally, a single shielding extension 88 may be included on the lid body 82. Like the previous embodiments, a lid flange 90 may be coupled to the lid body 82 in any number of ways. For example, the lid flange 90 may be brazed soldered to the lid body 82. The shielding lid body 82 may be manufactured from a variety of high Z materials, including, without limitation, tungsten, copper-tungsten alloys, tantalum, molybdenum, or other materials capable of limiting the amount of radiation passing therethrough. Optionally, the lid flange 90 may be manufactured from non-radiation shielding materials commonly used in the integrated circuit or semiconductor manufacturing process, including, without limitation, ceramic materials and metallic materials. When coupled to the body of a radiation shielded device package, the extensions 84 and 86 formed on the lid body 82 are configured to be positioned within and extend into the device cavity 30 (See FIG. 1), thereby enhancing the side-shielding capabilities. Those skilled in the art will appreciate that the radiation shielded lid 80 may be used with any embodiment of the radiation shielded package described herein in addition to commercially available integrated circuit or semiconductor packages.

The present application also discloses a novel method of manufacturing a radiation shielded integrated circuit or semiconductor package. Those skilled in the art will appreciate that the method described herein is intended to illustrate one method of manufacturing a radiation shielded integrated circuit or semiconductor device and is not intended to be limiting. Referring to FIG. 1, a sidewall 14 manufactured from a non-shielding material such as ceramic material and metallic material may be brazed or soldered to a shielding base 12 manufactured from a high Z material using brazing or soldering methods known in the art. The base 12 may have an integrated circuit or semiconductor. Similarly, a shielding flange 16 manufactured from a high Z material may be brazed or soldered to the sidewall 14. Those skilled in the art will appreciate that the incorporation of a shielding flange 16 provides a novel side-shielded package 10. In addition, a non-shielding coupling flange 18 manufactured from a non-shielding material such as ceramic material and metallic material may be brazed or soldered to a shielding flange 14.

Referring again to FIG. 1, a non-shielding lid flange 24 is brazed or soldered to a shielding lid body 22 manufactured from a high Z material, thereby forming a shielding lid 20. In one embodiment, the shielding lid 20 having a non-shielding lid flange 24 disposed thereon may be coupled to the non-shielding coupling flange 18 by resistance welding, thereby sealing the integrated circuit or semiconductor device 32 within the device cavity 30. In one embodiment, the integrated circuit or semiconductor device 32 is hermetically sealed within the device cavity 30. In an alternate embodiment, the integrated circuit or semiconductor device is in communication with the environment outside the device cavity 30.

Further, the present application discloses a method of radiation shielding an integrated circuit or semiconductor device from a Total Ionizing Dose (TID) while improving the resistance of the device to Single Even Effects (SEE). Presently, commercially available integrated circuit or semiconductor dies offer substantial performance advantages over specially designed radiation hardened devices. Often, two common problems leading to a SEE event relate to Single Event Burnout (SEB) and Single Event Gate Rupture (SEGR). For example, a specially designed hardened MOSFET has about a 30V rating and an efficiency rating of about 3.5 μΩ. In contrast, a commercially available die may have a voltage rating of about 60V and an efficiency rating of about 3.5 μΩ. One embodiment of a method of improving a device to a SEE event comprises de-rating a commercial device from voltage rating of about 60V to about 30V. In the illustrated embodiment, the voltage rating was de-rated by about 50%. Those skilled in the art will appreciate that the device may be de-rated from about 0.1% to about 1000%. The efficiency rating of the de-rated commercial device remains at about 3.5 μΩ. As s result, the de-rating process provides a device with enhanced ability to withstand SEE events without the performance reduction typically associated in a specially designed MOSFET.

In closing it is understood that the embodiments of a radiation shielded integrated circuit or semiconductor package disclosed herein are not intended to that precisely as shown and described in the present application. Further, those skilled in the art will appreciate that the various systems and device disclosed herein may be used in a variety of environments, including, without limitation, space applications, nuclear medical devices and applications, power generation applications including nuclear power applications, defense related applications, and the like.

What is claimed is:

1. A radiation shielded semiconductor package, comprising:
    a radiation shielding base;
    one or more non-shielding sidewalls coupled to the shielding base;
    one or more radiation shielding flanges coupled to the sidewall;
    one or more non-shielding coupling flanges coupled to the shielding flange, wherein the base, the non-shielding sidewall, the shielding flange, and the non-shielding coupling flange define a device cavity;
    at least one semiconductor device positioned within the device cavity; and
    a radiation shielding lid coupled to the coupling flange and sealing the semiconductor device within the device cavity, the shielding lid having a shielding lid body and a non-shielding lid flange coupled to the lid body and configured to couple to the coupling flange.

2. The package of claim 1 wherein the radiation shielding base, flange, and lid are constructed from a high Z material.

3. The package of claim 1 wherein at least one of the radiation shielding base, flange, and lid are constructed from tungsten.

4. The package of claim 1 wherein at least one of the radiation shielding base, flange, and lid are constructed from copper-tungsten alloys.

5. The package of claim 1 wherein at least one of the radiation shielding base, flange, and lid are constructed from tantalum.

6. The package of claim 1 wherein at least one of the radiation shielding base, flange, and lid are constructed from molybdenum.

7. The shielding base of claim 1 wherein the base further comprises at least one passthrough configured to have at least one lead traverse therethrough.

8. The package of claim 1 wherein the sidewall comprises at least one passthrough configured to have at least one lead traverse therethrough.

9. The package of claim 1 wherein the radiation shielded package is configured to be coupled to a substrate using surface mount technology.

10. The package of claim 1 wherein the radiation shielded package is configured to be coupled to a substrate using non-surface mount technology.

11. The package of claim 1 wherein the shielding lid further comprises one or more extension positioned thereon, the one or more extension configured to extend into the device cavity.

12. A radiation shielded semiconductor package, comprising:
    a shielding base manufactured from a high Z material;
    a non-shielding sidewall coupled to the shielding base;
    a radiation shielding flange manufactured from a high Z material coupled to the sidewall;
    a non-shielding coupling flange coupled to the shielding flange, wherein the base, the non-shielding sidewall, the shielding flange, and the non-shielding coupling flange define a device cavity;
    at least one semiconductor device positioned within the device cavity; and a radiation shielding lid manufactured from a high Z material coupled to the coupling flange and sealing the semiconductor device within the device cavity, the shielding lid having a shielding lid body and a non-shielding lid flange coupled to the lid body and configured to couple to the coupling flange.

13. The package of claim 12 wherein the radiation shielded package is configured to be coupled to a substrate using surface mount technology.

14. The package of claim 12 wherein the radiation shielded package is configured to be coupled to a substrate using non-surface mount technology.

15. The package of claim 12 wherein at least one of the base, the non-shielding sidewall, and the lid includes one or more passthrough configured to have one ore more leads traversing therethrough.

16. The package of claim 12 wherein the shielding flange and coupling flange are configured to be joined in welded relation.

17. The package of claim 12 wherein the lid includes one or more extension positioned thereon, the extensions configured to extend from the lid into the device cavity.

18. The package of claim 12 wherein the semiconductor device comprises a commercial die having a voltage rating de-rated by about 50%.

19. A method of manufacturing a radiation shielded device, comprising:

coupling one or more non-shielding sidewalls to a shielding base;

coupling one or more shielding flanges coupled to the sidewall;

coupling one or more non-shielding coupling flanges coupled to the shielding flange, wherein the base, the non-shielding sidewall, the shielding flange, and the non-shielding coupling flange define a device cavity;

positioning at least one semiconductor device positioned within the device cavity; and coupling a radiation shielding lid to the coupling flange thereby sealing the semiconductor device within the device cavity, the shielding lid having a shielding lid body and a non-shielding lid flange coupled to the lid body and configured to couple to the coupling flange.

20. A method of making a radiation shielded device, comprising:

coupling one or more non-shielding sidewalls to a shielding base;

coupling one or more shielding flanges coupled to the sidewall;

coupling one or more non-shielding coupling flanges coupled to the shielding flange, wherein the base, the non-shielding sidewall, the shielding flange, and the non-shielding coupling flange define a device cavity;

de-rating a voltage rating of at least one commercial semiconductor device by about 50%;

positioning the semiconductor device positioned within the device cavity; and coupling a radiation shielding lid to the coupling flange thereby sealing the semiconductor device within the device cavity, the shielding lid having a shielding lid body and a non-shielding lid flange coupled to the lid body and configured to couple to the coupling flange.

* * * * *